(12) United States Patent
Figueredo et al.

(10) Patent No.: US 6,710,681 B2
(45) Date of Patent: Mar. 23, 2004

(54) THIN FILM BULK ACOUSTIC RESONATOR (FBAR) AND INDUCTOR ON A MONOLITHIC SUBSTRATE AND METHOD OF FABRICATING THE SAME

(75) Inventors: Domingo A. Figueredo, Livermore, CA (US); Richard C. Ruby, Menlo Park, CA (US); Yury Oshmyansky, Camarillo, CA (US); Paul Bradley, Mt. View, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/906,581

(22) Filed: Jul. 13, 2001

(65) Prior Publication Data

US 2003/0009863 A1 Jan. 16, 2003

(51) Int. Cl.⁷ .............................. H03H 9/54; H03H 9/56
(52) U.S. Cl. .................. 333/187; 333/191; 310/324; 310/349; 310/363; 336/200; 257/531
(58) Field of Search ................. 333/186–192; 257/531; 29/25, 35; 336/200; 310/324, 349, 351, 363

(56) References Cited

U.S. PATENT DOCUMENTS

| | | | |
|---|---|---|---|
| 3,222,622 A | 12/1965 | Curran et al. | 333/192 |
| 4,320,365 A | 3/1982 | Black et al. | 333/187 |
| 5,075,641 A * | 12/1991 | Weber et al. | 331/108 C |
| 5,384,274 A * | 1/1995 | Kanehachi | 437/47 |
| 5,539,241 A * | 7/1996 | Abidi et al. | 257/531 |
| 5,587,620 A | 12/1996 | Ruby et al. | 310/346 |
| 5,853,601 A * | 12/1998 | Krishaswamy et al. | 216/2 |
| 5,873,153 A | 2/1999 | Ruby et al. | 29/25.35 |
| 5,894,647 A | 4/1999 | Lakin | 29/25.35 |
| 5,930,637 A * | 7/1999 | Chuang et al. | 438/381 |
| 6,060,818 A | 5/2000 | Ruby et al. | 310/363 |
| 6,081,171 A * | 6/2000 | Ella | 333/189 |
| 6,111,520 A * | 8/2000 | Allen et al. | 340/870.16 |
| 6,274,937 B1 * | 8/2001 | Ahn et al. | 257/777 |
| 6,285,069 B1 * | 9/2001 | Yoshida | 257/531 |

FOREIGN PATENT DOCUMENTS

JP 6-77407 * 3/1994 ................. 257/929

OTHER PUBLICATIONS

Rosenbaum, J. et al.; "Design and Fabrication of Two–Pole Monolithic Bulk Acoustic Filters", *IEEE 1990 Microwave and Millimeter–Wave Monolithic Circuits Symposium*; pp. 63–66, May, 1990.*

Chen–Yu Chi et al.; "Planar Millimeter–Wave Microstrip Lumped Elements Using Micro–Machining Techniques", *1994 IEEE Microwave Symposium MTT–S Digest*; pp. 657–660, vol. 2, May, 1994.*

Seabury, C.W. et al.; "Thin Film ZnO Based Bulk Acoustic Mode Filters", *1997 IEEE Microwave Symposium MTT–S Digest*; vol. 1, pp. 181–184, Jun., 1997.*

Sun, Y. et al.; "Suspended Membrane Inductors and Capacitors for Application in Silicon MMIC's", *IEEE 1996 Microwave and Millimeter–Wave Monolithic Circuits Symposium*; pp. 99–102, Jun., 1996.*

Domingo Figueredo, et al., "Thin Film Bulk Acoustic Wave Resonators (FBAR) and Filters for High Performance Wireless Systems", Feb. 1999, pp. 1–6.

John D. Larson III, SM, et al., "A BAW Antenna Duplexer for the 1900 MHz PCS Band," Oct. 1999; This paper appears in: *Ultrasonics Symposium, 1999, Proceedings*, vol. 2, pp. 887–890.

* cited by examiner

*Primary Examiner*—Barbara Summons

(57) ABSTRACT

An apparatus having both a resonator and an inductor fabricated on a single substrate and a method of fabricating the apparatus are disclosed. The apparatus includes a resonator and an inductor that is connected to the resonator. Both the resonator and the inductor are fabricated over their respective cavities to produce a high Q-factor filter circuit.

13 Claims, 3 Drawing Sheets

THIN FILM BULK ACOUSTIC RESONATOR (FBAR) AND INDUCTOR ON A MONOLITHIC SUBSTRATE AND METHOD OF FABRICATING THE SAME

The present invention relates to filter circuits, and more particularly, to filters including acoustic resonators used as filters for electronic circuits.

The need to reduce the cost and size of electronic equipment has led to a continuing need smaller filter elements. Consumer electronics such as cellular telephones and miniature radios place severe limitations on both the size and cost of the components contained therein. Many such devices utilize filters that must be tuned to precise frequencies. Hence, there has been a continuing effort to provide inexpensive, compact filter units.

One class of filters that has the potential for meeting these needs is constructed using a thin film bulk acoustic resonators (FBARs). These devices use bulk longitudinal acoustic waves in thin film piezoelectric (PZ) material. In a typical configuration as illustrated by FIG. 1, a filter 10 includes a series resonator 12 connected to a shunt inductor 14 which may be adjustable for the purposes of tuning the filter 10.

The resonator 12 is fabricated on a semiconductor substrate that is packaged as a chip and mounted on a printed circuit board (PCB). Typically, the inductor 14 is attached to the PCB or mounted in a module using multiple chips and wire bonds, separate from the chip containing the resonator 10. Then, the inductor is connected to the resonator via output connector leads from the chip including the resonator 10.

Such external inductor connections lead to signal loss between the resonator 10 and the inductor 14 and decrease in reliability due to the connection. Also, the manufacturing step must involve soldering or a step of attaching the resonator 12 on the chip to the inductor 14 located outside the chip.

Consequently, there is a need to provide an FBAR filter overcoming these shortcomings.

SUMMARY

These needs are met by the present invention. According to one aspect of the present invention, an apparatus having a resonator and an inductor, both fabricated on a single substrate is disclosed. The resonator is fabricated bridging a first cavity; and the inductor is fabricated bridging a second cavity. The inductor is connected to the resonator.

According to a second aspect of the present invention, an electronic filter including a resonator is fabricated on a substrate bridging a first cavity and an inductor is fabricated on the substrate bridging a second cavity, the inductor connected to the resonator.

According to a third aspect of the present invention, a method of fabricating an electronic filter on a substrate is disclosed. First, a resonator is fabricated on the substrate. In addition, an inductor, connected to the resonator, is fabricated on the substrate.

According to a fourth aspect of the present invention, another method of fabricating an electronic filter on a substrate is disclosed. First, a cavity is fabricated within the substrate. Next, the cavity is filled with sacrificial material. Then, an inductor is fabricated above the cavity. Finally, the sacrificial material is removed from the cavity.

Other aspects and advantages of the present invention will become apparent from the following detailed description, taken in combination with the accompanying drawings, illustrating by way of example the principles of the invention.

DETAILED DESCRIPTION

Figure 1:
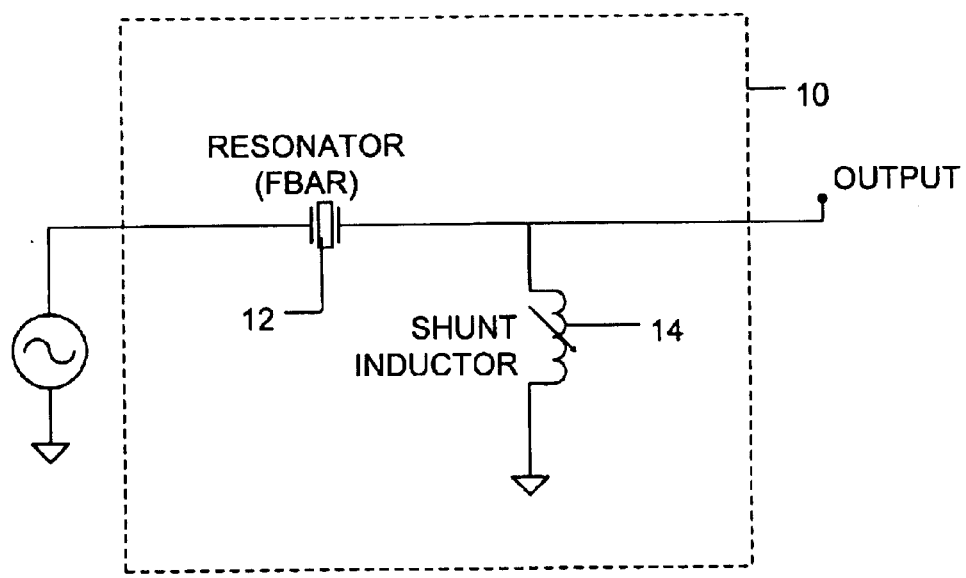
FIG. 1 illustrates an electronic filter circuit.

As shown in the drawings for purposes of illustration, the present invention is embodied in an electronic filter having a resonator fabricated on a substrate and an inductor fabricated on the substrate. Because both the resonator and the inductor are fabricated on the same substrate, connection loss and connection reliability problems are eliminated. Further, because this configuration simplifies assembly process, it reduces costs of manufacturing and for parts.

Figure 2A:
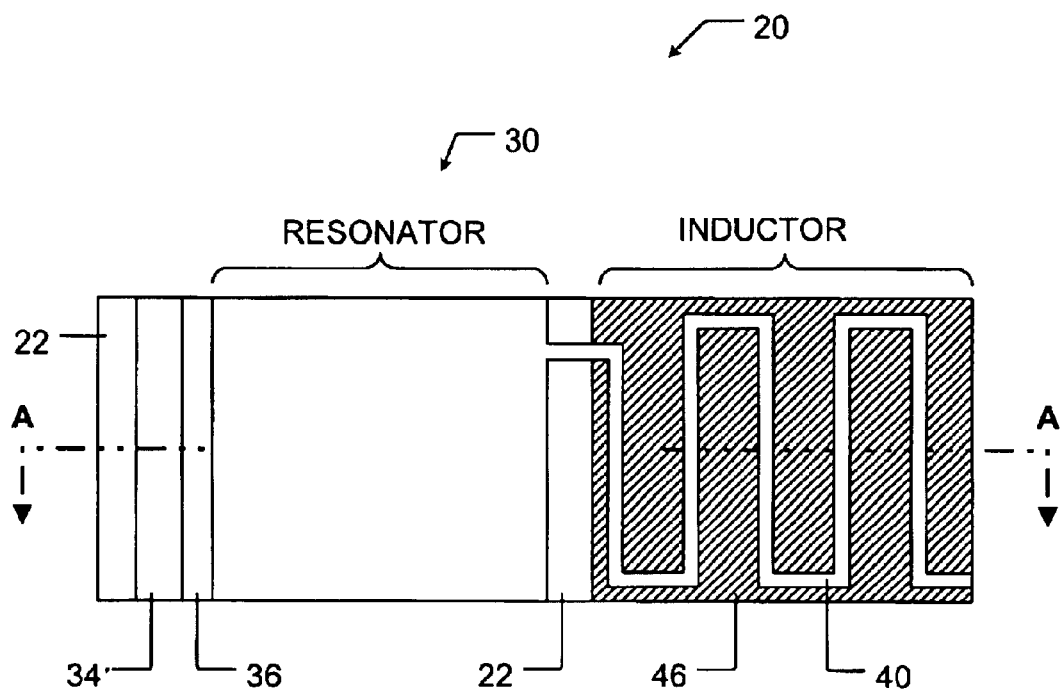
FIG. 2A is a top view of an apparatus in accordance to one embodiment of the present invention.
Figure 2B:
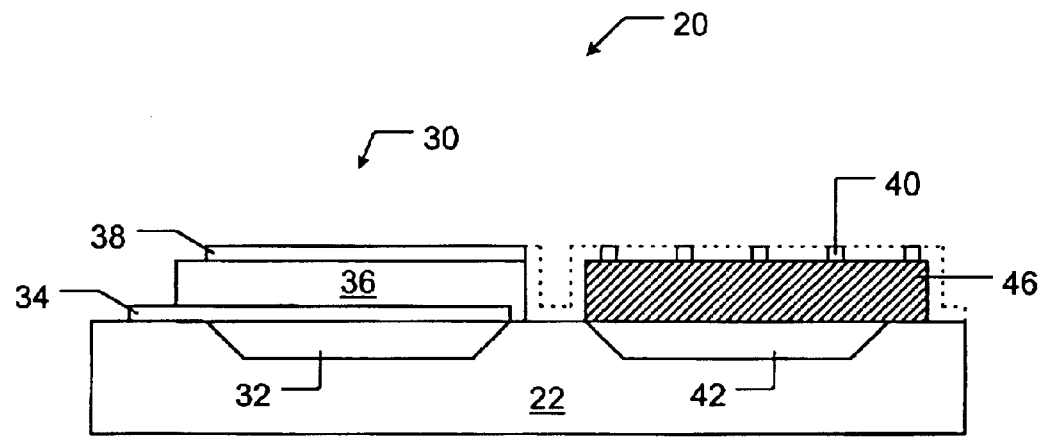
FIG. 2B is a sectional side view of the apparatus of FIG. 2A.

A top view of an apparatus 20 according to one embodiment of the present invention is illustrated in FIG. 2A. A cut-away side view of the apparatus 20 along line A—A is illustrated in FIG. 2B. Referring to FIGS. 2A and 2B, the apparatus 20 includes a resonator 30 fabricated on a substrate 22, the resonator 20 bridging a first cavity 32. The apparatus 20 also includes an inductor 40 also fabricated on the substrate 22, the inductor 40 bridging a second cavity 42. The inductor 40 is connected to the resonator 30 as further discussed herein below. Because both the inductor 40 and the resonator 30 are fabricated suspended over cavities, high quality factor, Q, is achieved. In the case of the resonator 30, the high Q value stems from the fact that the layers making up the resonator 30 are mostly suspended above the wafer surface and physically attached only at chosen perimeter points. The suspended membrane approach results in low acoustic loses when the electrical signals are converted into acoustic signals. For the inductor 40 fabricated over the substrate cavity 42, Q increases because the electric and magnetic field coupling loss between the substrate 22 and the inductor 40 is much reduced by increasing the separation between the inductor 40 and the substrate 22 and by removing the dielectric effects of the substrate 22.

In the illustration, the resonator 30 is a thin film bulk acoustic resonator (FBAR). In the illustrated embodiment, the FBAR 30 includes a piezoelectric (PZ) layer 36 sandwiched between two electrodes—a bottom electrode 34 and a top electrode 38. The PZ layer 36 may include Aluminum Nitride (AlN). The electrodes 34 and 38 are conductors, for example Molybdenum.

The resonator top electrode 38 is connected to the inductor 40. In the Figures, the top electrode 38 of the resonator 30 is connected to the inductor 40 via the top electrode 38. The inductor is made of conducting material, for example Molybdenum. As illustrated, the inductor may be fabricated above a support structure 46. The support structure 46 may include Aluminum Nitride (AlN). In the Figures, the support structure 46 is depicted with hash marks to more clearly illustrate the inductor 40 fabricated over the support structure 46.

Resonator for applications in the GHz range may be constructed with physical dimensions on the order of less than 100 microns in lateral extent and a few microns in thickness. Accordingly, the inductor may be a few microns in thickness and similar lateral size as the resonator. It is known that frequency of the resonator 30 depends inversely on the thickness of the resonator 30. The inductance of the inductor 40 depends on various factors such as the length of the inductor 40, the width of the inductor 40, the space (pitch) between the metal lines, and the thickness of the metal used. In one embodiment, inductances ranges from a fraction of a nano-Henry (0.1 nH) to perhaps approximately 5 nano-Henrys (5 nH) have been achieved using an inductor requiring a patterned area ranging from 0.25 mm$^2$ to 1 mm$^2$. The range in areas is dependent on the metallization used and the lithography resolution used to define the pitch.

The apparatus 20 is fabricated by fabricating the resonator 30 and the inductor 40, connected to the resonator 30, on the substrate 22. First, the first cavity 32 and the second cavity 42 are etched in the substrate 22 and filled with sacrificial material such as glass or other material which is later dissolved or otherwise removed to create the cavities. To fabricate the resonator 30, the bottom electrode layer 34 is first fabricated. Then, the PZ layer 36 is fabricated, and the top electrode layer 38 is fabricated.

Figure 3A:
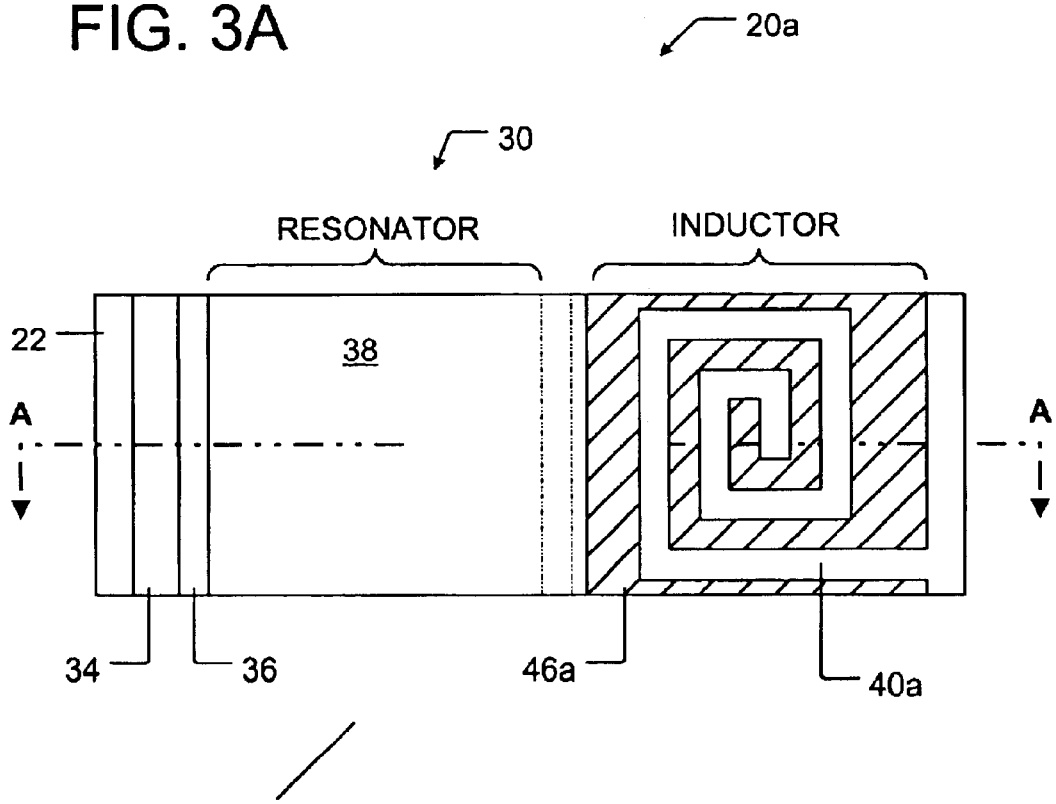
FIG. 3A is a top view of an apparatus in accordance to another embodiment of the present invention.
Figure 3B:
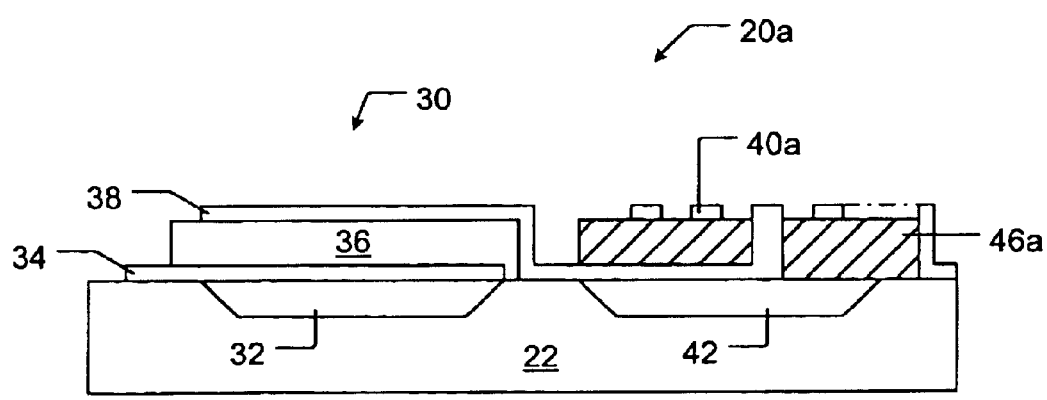
FIG. 3B is a sectional side view of the apparatus of FIG. 3A.

To fabricate the inductor, the support structure is fabricated first, and then the inductor 40 is fabricated over the support structure 46. FIGS. 2A and 2B shows the inductor in a serpentine shape; however, the invention is not limited to the illustrated shape. For example, FIGS. 3A and 3B illustrates an alternative embodiment of the inductor 40a. An alternative embodiment of the present invention having different inductor configuration is shown in FIGS. 3A and 3B. Portions of this embodiment is similar to shown in FIGS. 2A and 2B. For convenience, components in FIGS. 3A and 3B that are similar to components in FIGS. 2A and 2B are assigned the same reference numerals, analogous but changed portions are assigned the same reference numerals accompanied by letter "a", and different components are assigned different reference numerals.

Referring to FIGS. 3A and 3B, an apparatus 20a includes a resonator 30 and an inductor 40a fabricated on a substrate 22. Here, the configuration of the inductor 40a is spiral shape which is different from the serpentine shaped inductor 40 illustrated in FIGS. 2A and 2B.

Referring again to FIGS. 2A and 2B, typically, the glass material of the cavities 32 and 42 are removed following the fabrication of the resonator 30 and the inductor 40.

From the foregoing, it will be appreciated that the present invention is novel and offers advantages over the current art. The present invention provides a technique for fabricating a resonator and an inductor, connected to the resonator, on a single substrate. Further, an apparatus including both the resonator and the inductor on the same substrate reduces costs and minimizes connection losses. Although a specific embodiment of the invention is described and illustrated above, the invention is not to be limited to the specific forms or arrangements of parts so described and illustrated. The invention is limited only by the claims that follow.

What is claimed is:

1. An apparatus comprising:
    a resonator fabricated on a substrate, said resonator bridging a first cavity the first cavity substantially enclosed by the substrate and said resonator; and
    an inductor connected to said resonator, said inductor fabricated on the substrate bridging a second cavity, the second cavity substantially enclosed by the substrate and said inductor.

2. The apparatus recited in claim 1 wherein the resonator is a thin film bulk acoustic resonator.

3. The apparatus recited in claim 1 wherein the resonator comprises a piezoelectric (PZ) layer sandwiched between two electrodes.

4. The apparatus recited in claim 3 wherein the PZ layer comprises Aluminum Nitride (AiN).

5. The apparatus recited in claim 1 wherein the resonator comprises Aluminum Nitride (AiN) layer.

6. The apparatus recited in claim 1 wherein the resonator comprises Molybdenum.

7. The apparatus recited in claim 1 wherein the inductor comprises Molybdenum.

8. An electronic filter comprising:
    a resonator fabricated on a substrate, said resonator bridging a first cavity, the firsts cavity substantially enclosed by the substrate and said resonator; and
    an inductor connected to said resonator, said inductor fabricated on the substrate bridging a second cavity, the second cavity substantially enclosed by the substrate and said inductor.

9. The electronic filter recited in claim 8 wherein the resonator is a thin film bulk acoustic resonator.

10. The electronic filter recited in claim 8 wherein the resonator comprises a piezoelectric (PZ) layer sandwiched between two electrodes.

11. The electronic filter recited in claim 10 wherein the PZ layer comprises Aluminum Nitride (AlNI).

12. The electronic filter recited in claim 8 wherein the resonator comprises Molybdenum.

13. The electronic filter recited in claim 8 wherein the resonator comprises Aluminum Nitride (AlN) layer.

* * * * *